US006356160B1

(12) United States Patent
Robinson et al.

(10) Patent No.: US 6,356,160 B1
(45) Date of Patent: Mar. 12, 2002

(54) PHASE LOCK LOOP AND AUTOMATIC GAIN CONTROL CIRCUITRY FOR CLOCK RECOVERY

(75) Inventors: Moises E. Robinson, Austin, TX (US); Bernard L. Grung, Eden Prairie, MN (US); Yiqin Chen, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/347,256

(22) Filed: Jul. 2, 1999

(51) Int. Cl.$^7$ ................................. H03L 7/07; H03L 7/087
(52) U.S. Cl. ................................. 331/17; 331/8; 331/10; 331/11; 327/62; 327/111; 327/147; 327/148; 327/156; 327/157; 375/376; 455/260
(58) Field of Search ................................. 331/8, 10, 11, 331/17, 18, 25; 327/62, 108–112, 147–150, 156–159; 360/51; 375/376; 455/260

(56) References Cited

U.S. PATENT DOCUMENTS

| 5,015,970 A | * 5/1991 | Williams et al. ............... 331/11 |
| 5,448,598 A | 9/1995 | Yousefi et al. |
| 5,483,180 A | 1/1996 | Chai et al. ..................... 326/93 |
| 5,574,756 A | 11/1996 | Jeong ........................... 375/376 |

FOREIGN PATENT DOCUMENTS

| EP | 0595632 | 10/1993 | ........... H03L/7/107 |
| EP | 0856946 | 8/1998 | ........... H03L/7/085 |

OTHER PUBLICATIONS

Lin, J.Y., et al., "Design of Clock Recovery MMIC using large–signal computer–aided analysis", *Microwave Symp. Degest, IEEE MTT–S Int'l,* vol. 3, XP002135220, 1181–1184, (1995).

Wu, L., et al., "A Low Jitter 1.25GHz CMOS analog PLL for clock recovery", *Proceedings of the 1998, IEEE Int'l Symp. of Circuits and Systems, ISCAS '98* vol. 1, XP002135219, 167–170, (May 1998).

Akin, T., "A Wireless Implantable Multichannel Digital Neural Recording System for a Micromachined Sieve Electrode", *IEEE Journal of Solid–State Circuits*, 33, 109–118, (Jan. 1998).

Fiedler, A., et al., "A 1.0625Gbps Transceiver with 2x–Oversampling and Transmit Signal Pre–Emphasis", *ISSCC97/Session 15./Serial Data Communications/Paper FP 15.1*, IEEE Solid States Circuit Conference, 238, (1997).

Gardner, F.M., "Charge–Pump Phase–Lock Loops", *IEEE Trans. Commun.* vol. COM–28, 321–329, (Nov., 1980).

Gardner, F.M., "Phase Accuracy of Charge Pump PLL's", *IEEE Trans. Commun,* COM–30, 2362–2363, (Oct. 1982).

Gardner, F.M., "Sequential Phase Detectors", In: PhaseLock Technologies, Second Edition, John Wiley & Sons, 121–125, 1979.

Gregorian, R., et al., "Switched–Capacitor Circuit Design", *IEEE*, 71, 941–966, (Aug. 1983).

Hogge, Jr., C.L., "A Self Correcting Clock Unit", *IEEE Journal of Lightwave Technology*, vol. LT–3, 1312–1314, (Dec., 1985).

(List continued on next page.)

Primary Examiner—David Mis
(74) Attorney, Agent, or Firm—Schwegman Lundberg Woessner Kluth

(57) ABSTRACT

A high speed data communication system includes a receiver to recover data and clock signals from communicated data. The receiver circuit has a dual phase lock loop (PLL) circuit. A fine loop of the PLL includes a phase detector providing a differential analog voltage output. Transconductance circuitry converts the differential analog voltage output to a low current analog output. The transconductance circuitry has a variable gain which is controlled by an automatic gain adjust circuit. A coarse loop of the PLL allows for fast frequency acquisition of an internal oscillator.

36 Claims, 12 Drawing Sheets

OTHER PUBLICATIONS

Meyer, R.G., et al., "Monolithic AGC Loop fpr a 160 Mb/s Transimpedance Amplifier",*IEEE Jornal of Solid–State Circuits*, 31, 1331–1335, (Sep. 1996).

Moon, Y., "A 32 x 32–b Adiabatic Register File with Supply CLock Generator", *IEEE Journal of Solid–State Circuits*, 33, 696–701, (May 1998).

Nakamura, M., et al., "A 156–Mb/s CMOS Optical Receiver for Burst–Mode Transmission", *IEEE Journal of Solid–State Circuits*, 33, 1179–1187, (Aug. 1998).

Petersen, C., et al., "A 3.5VCMOS 32Mb/s Fully–Integrated Read Channel For Disk–Drives", *IEEE Custom Integrated Circuits Conference,vol. 10, Chptr. 2*, 1–4, (1993).

Rezzi, F., et al., "A 70–mW Seventh–Order Filter with 7–50 MHz Cutoff Frequency and Programmable Boost and Group Delay Equalization", *IEEE Journal of Solid State Circuits, vol. 32, No. 12*, 1987–1999, (Dec. 1997).

Steininger, J.M., "Understanding Wide–band MOS Transistors", *Circuitc and Devices*, 27–30, (May 1990).

Su, D.K., et al., "An IC for Linearizing RF Power Amplifiers Using Envelope Elimination and Restoration", *IEEE Journal of Solid State Circuits*, 33, 2252–2258, (Dec. 1998).

\* cited by examiner

PHASE LOCK LOOP AND AUTOMATIC GAIN CONTROL CIRCUITRY FOR CLOCK RECOVERY

TECHNICAL FIELD OF THE INVENTION

The present invention relates generally to clock recovery and in particular the present invention relates to automatic gain control circuitry for recovering a clock from high data rate signals.

BACKGROUND OF THE INVENTION

Clock and data recovery in high speed data communication systems require receiver circuits which can adjust an internal oscillator to a frequency and phase of the communicated data. For a description of clock recovery, see C. R. Hogge, "A Self Correcting Clock Recovery Circuit," IEEE, J. Lightwave Technol. LT-3 1312 (1985). Hogge describes a receiver circuit which adjusts a recovered clock signal to center the clock signal transitions in a center of the communicated data signal.

The receiver circuits typically require a phase lock loop circuit to acquire the clock signal from the transmitted data. Phase lock loop circuits adjust an internal oscillator to match a phase of an externally supplied reference signal, such as the received data signal. These phase lock loop circuits compare the reference signal to the internal oscillator signal and provide an output which is used to adjust the oscillator. For example, a parallel digital phase lock loop architecture is described in Fiedler et al., "A 1.0625 Gbps Transceiver with 2x-Oversampling and Transmit Signal Pre-Emphasis," ISSCC 1997 Dig. Tech. Papers, 238 (1997).

High speed data recovery in a communication system operating in excess of 1 GHz requires high speed components, a speed which is difficult to achieve in complementary metal oxide semiconductor (CMOS) fabrication. In particular, current CMOS fabrication sizes of about 0.18 to 0.35 micron have NMOS transistors with a frequency cutoff $f_t$ of about 10 to 15 GHz. Thus, processing a signal with a frequency of about 1.25 GHz pushes the transistors to their limitations. Further, gain control in a conventional receiver circuit adjusts the input signal prior to processing with a phase lock loop. Using CMOS processing, accurately adjusting the gain of the high frequency input data is not presently possible. The economics of IC fabrication create a need for a solution to high speed clock recovery using CMOS technology.

For the reasons stated above, and for other reasons stated below which will become apparent to those skilled in the art upon reading and understanding the present specification, there is a need in the art for a CMOS receiver circuit capable of recovering a clock signal and data in a high speed data communication system. Further, there is a need for a receiver which can automatically adjust gain to changes in the communication data voltage.

SUMMARY OF THE INVENTION

The above mentioned problems with high speed data communication receiver circuits and other problems are addressed by the present invention and will be understood by reading and studying the following specification.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The term "serial" is used here to define a receiver architecture for which the clock recovery and the data recovery are accomplished at the full data rate, for example 1.25 Gb/s. The serial approach requires circuits to operate with a 1.25 GHz clock rate—a requirement that is very difficult to achieve with a 0.25 or 0.35 μm CMOS integrated circuit fabrication process.

The term "parallel" is used here to define a receiver architecture where the input data stream is sampled at a sampling rate of at least the full data rate, such as 1.25 Gb/s or greater, and the sampled data is processed in several parallel paths. Each path can then operate with a relaxed clock rate compared to the serial approach.

Figure 1:
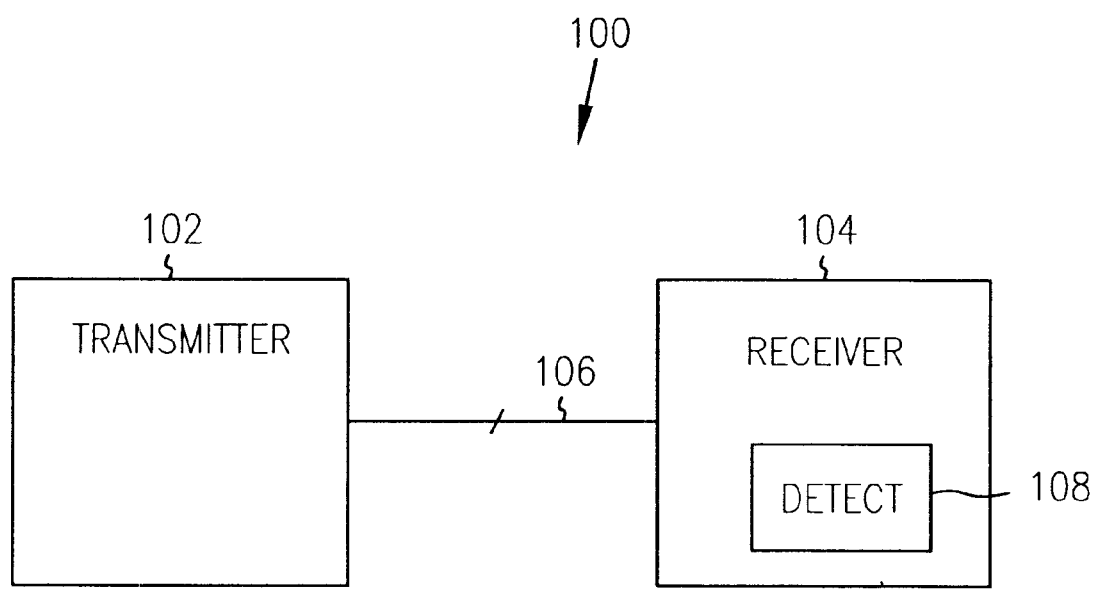
FIG. 1 is a block diagram of a data communication system.

Referring to FIG. 1, a communication system 100 is described which operates at high communication speeds. The system includes transmitter 102 and receiver 104 units. The data connections 106 between the transmitter and the receiver units can operate at data rate speeds of about 1.25 Gb/s or greater. The data connections 106 do not include a clock line for synchronizing the receiving units with the transmitting units, but can include complementary data lines. As such, the receiving units include detection circuitry 108 for recovering the clock signal from the received data. In one embodiment, the detection circuitry includes a dual loop phase lock loop (PLL) circuit connected to receive the incoming data signals. The dual loop function allows frequency acquisition with a coarse loop and precise phase control with a fine loop. The receiver, in one embodiment, includes a transconductance function with a small value, such as about 10 µS (microSiemens). Further, a variable gain function can be provided in the phase lock loop circuit to allow for variable input signal voltages.

Figure 2:
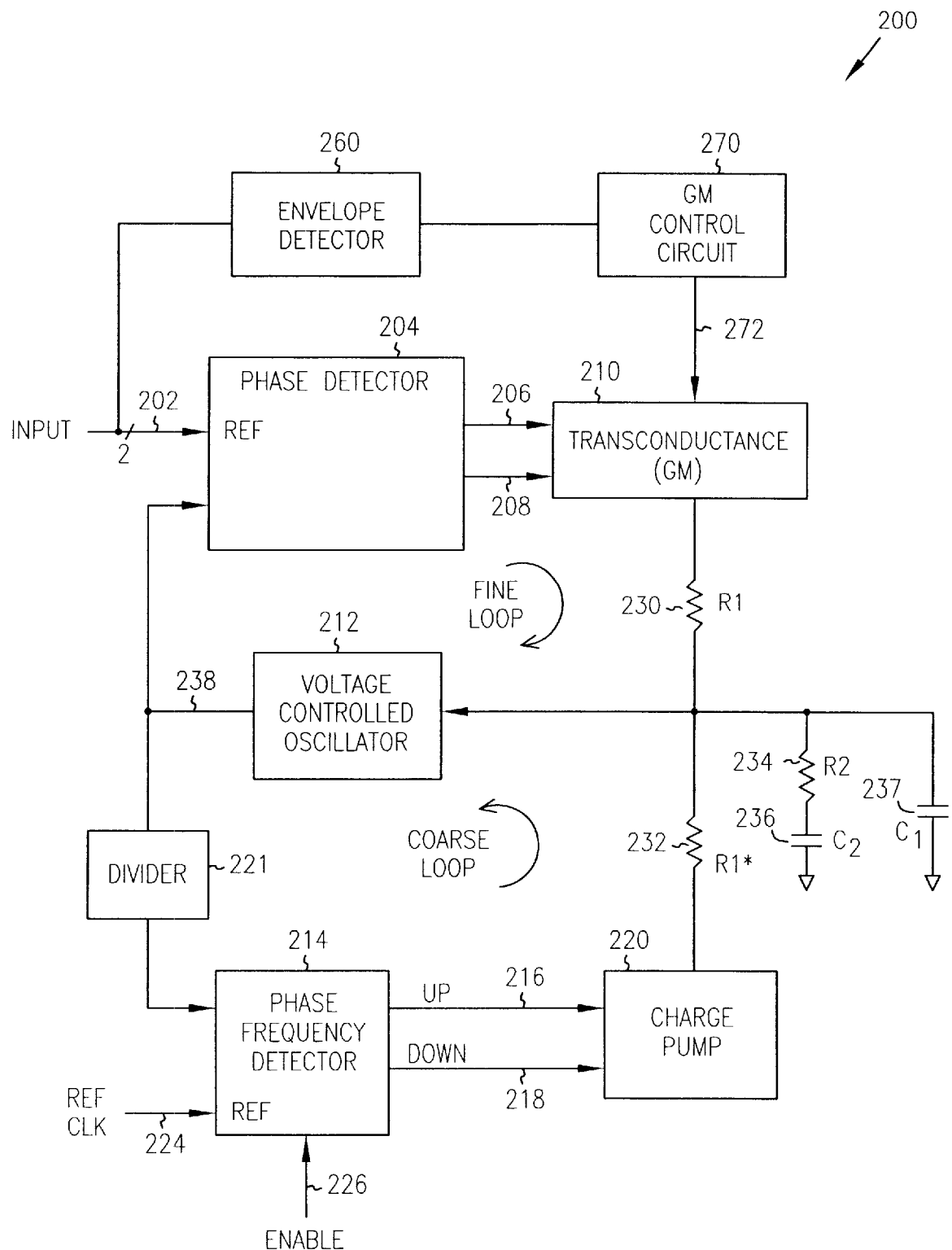
FIG. 2 is a diagram of a dual loop phase lock loop circuit of the present invention.

FIGS. 2–9 illustrate different embodiments of phase lock loop circuits and transconductance circuitry. The basic phase lock loop circuit 200 includes a coarse loop, a fine loop, an envelope detector 260 and transconductance control circuitry 270 to control the value of the transconductance in the fine loop (FIG. 2). The transconductance control circuitry provides a control output on connection 272, and embodiments of the envelope detector and transconductance control circuitry are described in greater detail below. The fine loop uses a phase detector 204 which provides differential analog voltage outputs 206 and 208, $Vi_P$ and $Vi_N$, respectively. The fine loop processes the input data provided on complimentary data lines 202, as the phase reference for phase detector 204. The analog outputs of the phase detector are converted to an analog current by a unique transconductance circuit 210. The analog output current is coupled to a voltage controlled oscillator (VCO) 212. The VCO can be any kind of oscillator, including but not limited to a ring oscillator. The VCO is coupled to a second input of the phase detector. In operation, the fine loop adjusts the VCO signal to correspond to the phase of the input data. In one embodiment, the voltage controlled oscillator 212 is a five-stage ring oscillator which is tapped to provide ten output clock signals with the same frequency, but different phases.

The coarse PLL uses a reference clock signal 224, for example 62.5 MHZ, as a frequency reference for a phase-frequency detector (PFD) 214 for rapid frequency acquisition. The PFD is coupled to a charge pump circuit 220 which in turn adjusts an input voltage of voltage controlled oscillator 212. As illustrated, VCO 212 is shared between the coarse and fine loops of the phase lock loop circuit.

A detailed description of the phase lock loop circuitry is provided in the following paragraphs. The phase lock loop circuit is broken into two halves, the fine and coarse loops. A description of the fine loop circuitry is first provided, followed by the coarse loop.

Figure 3:
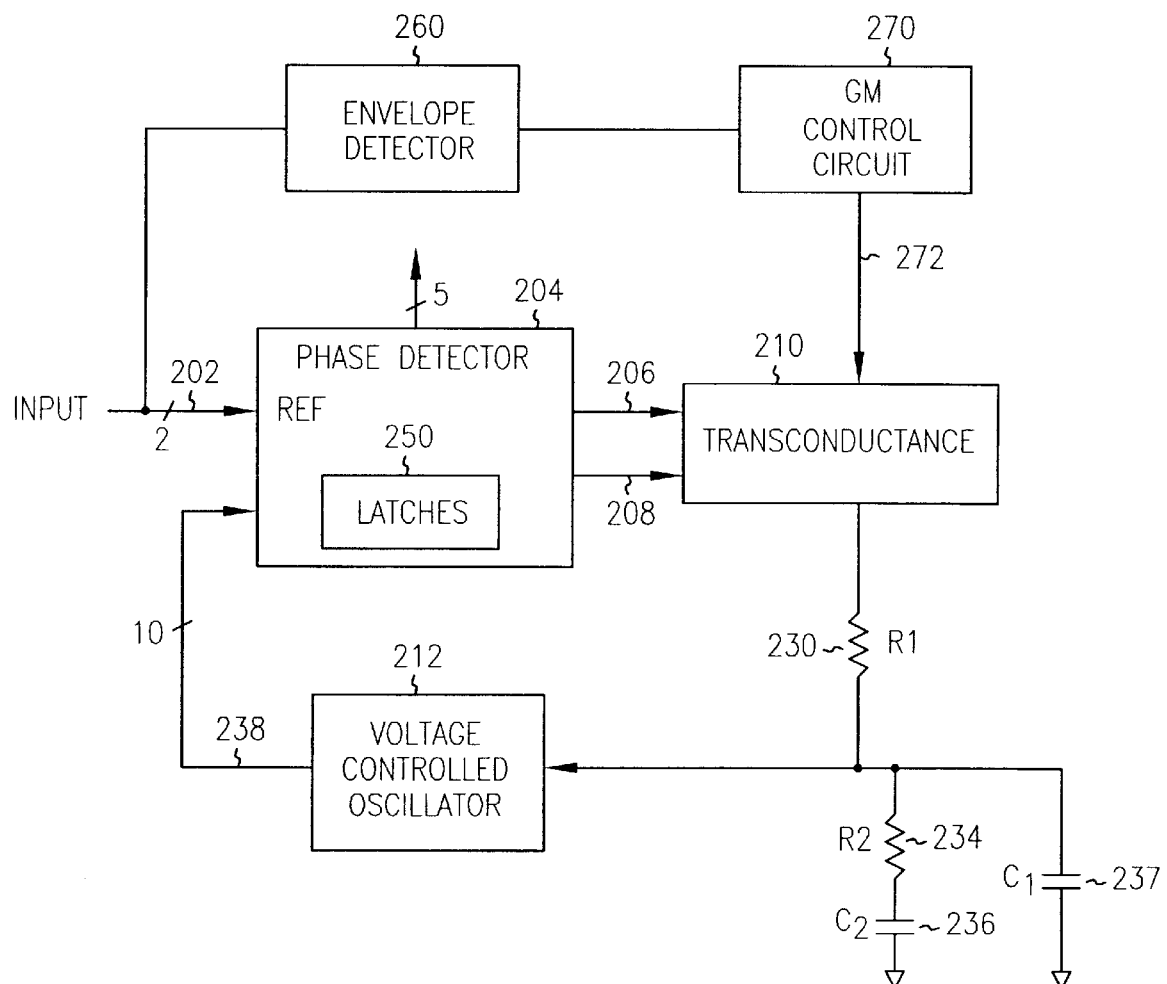
FIG. 3 is a diagram of a fine loop circuit.

A schematic diagram of the fine PLL circuitry is given in FIG. 3. The phase detector (PD) 204 oversamples the input data by a factor of 2 and provides 5 parallel data outputs at 1/5 the input data rate. Input data lines 202 comprise complementary data lines. The complementary data lines are referred to as a negative data connection (dvn) 205 and a positive data connection (dvp) 207, shown in FIGS. 9–12 below. The terms positive and negative define a relation between the two connections, and do not represent a sign of the magnitude of the data signal provided thereon. Ten high-speed capture latches 250 are used to convert the serial input data into parallel data paths. That is, the input data is sampled twice per data bit. One sample is in the middle of the data period and the other sample is at the edge of the data period. The edge sample is used to adjust the phase of the PLL circuit, and the middle sample is used as one of the five parallel data outputs.

The five middle samples are also used as a logic function to determine the validity of the edge samples. When two adjacent middle samples have the same value, then the intervening edge sample is invalid and is rejected. When two adjacent middle samples differ in value, then the magnitude of the intervening edge sample is valid and the sign of the value needs to be determined. A positive sign is used for a positive transition, and a negative sign is used for a negative transition. When valid, the resulting edge sample is proportional to the phase error.

When the input data is provided at 1.25 Gb/s, each path operates with a 0.250 GHz clock. The PD, therefore, produces a complementary pair of analog voltage outputs 206 and 208 which have a differential voltage proportional to the phase error between the input data and a clock running at 5 times the voltage controlled oscillator frequency.

The transconductance circuit 210 converts this differential analog voltage to an analog current which passes through resistors 230 (R1) and 234 (R2) and which changes the charge on capacitor 236. An optional capacitor 237 can be coupled to resistor 234. The voltage divided by resistors 230 and 234 controls the oscillator 212 input voltage. The effective one-sided transconductance of the transconductance circuit is about 10 µS for a 1 V peak-to-peak single-ended input signal. Thus, a 1-V, single-sided, peak-to-peak error voltage produces a difference voltage of 2 V peak-to-peak and a 20 µA peak-to-peak output current (±10 µA peak current centered around 0 A). The operation of the fine PLL can be described by:

$$\omega_N = \sqrt{\frac{K_O 4 S g_m T_B}{\pi C_2}} \quad (1)$$

and $$\zeta = \frac{\omega_N}{2} R_2 C_2 \quad (2)$$

where $\omega_N$ is the natural frequency and $\zeta$ is the damping factor. In addition $K_O$ is the VCO gain, S is the maximum slew rate of the input to the phase detector, $g_m$ is the one-sided transconductance of the transconductor circuit, $T_B$ is the bit period, $R_2$ is the filter resistance and $C_2$ is the filter capacitance. Typical values of $\omega_N$ and $\zeta$ are $3.12 \times 10^7$/s and 0.7, respectively. For these values, $K_O = 2.43 \times 10^9$/s, S=2V/ns, $g_m$=10 uS, $T_B$=0.8 ns, $R_2$=900 ohms, and $C_2$=50 pF.

An important element in the receiver circuit 200 is the transconductance circuit 210 which must convert a 1 V single-sided error voltage signal into a current of approximately 10 µA for controlling the voltage controlled oscillator 212. In one embodiment, the transconductance circuit 210 also provides variable gain amplification, as described below. The transconductance circuit contains, a double-sided to single-sided converter, source degeneration resistors to reduce overall gain, and current mirrors to reduce the current at the output by a factor of A, also as explained below. In one embodiment, the reduction factor A is equal to 10.

Figure 4:
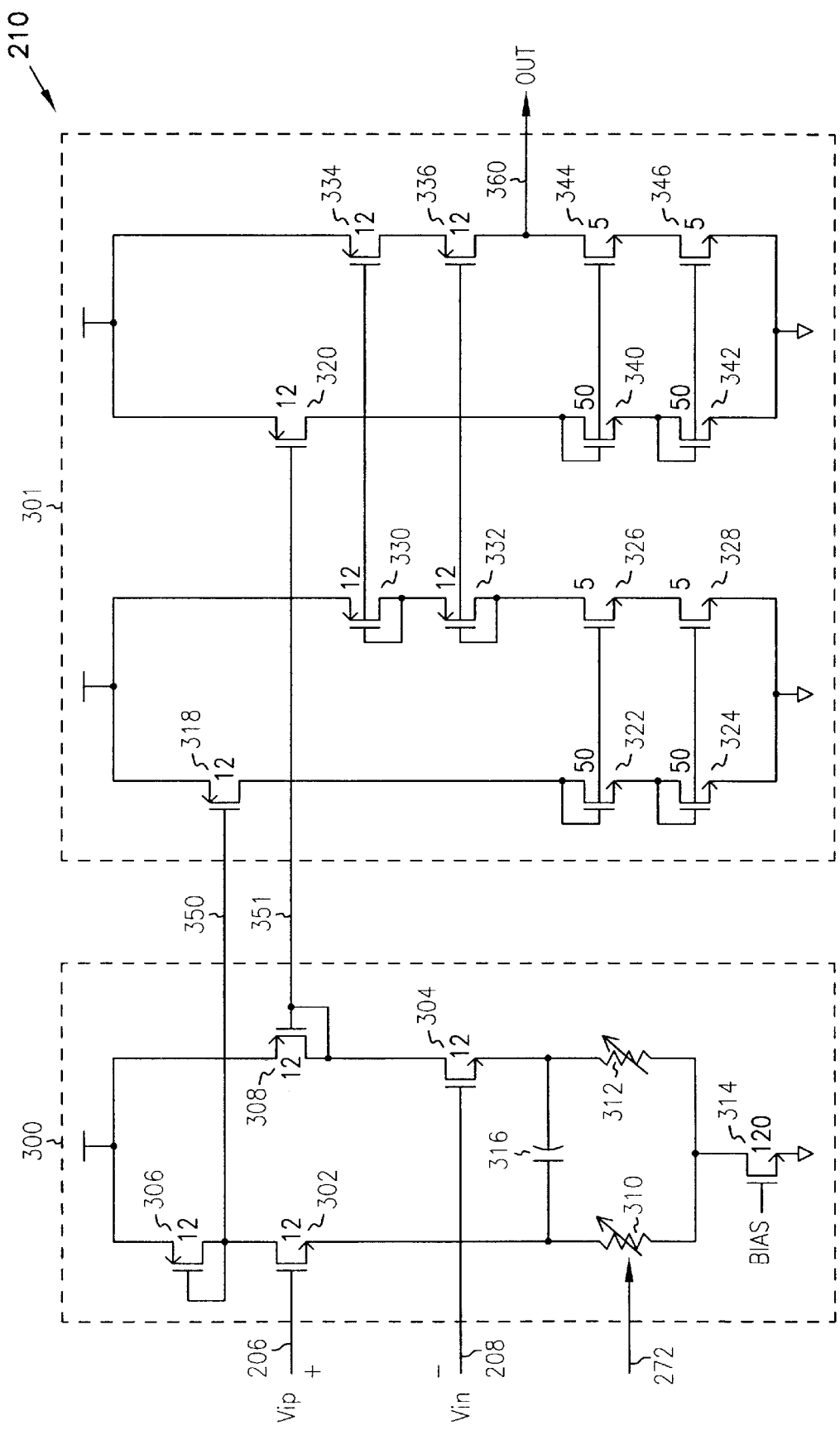
FIG. 4 is a schematic diagram of a transconductance circuit.

FIG. 4, illustrates a schematic diagram of one embodiment of the transconductance circuit. The transconductance circuit has an input stage 300 and an output stage 301. The input stage receives the differential voltage outputs from the phase detector circuit and provides intermediate outputs 350 and 351. The input stage operates as a differential amplifier with active loads (transistors 306 and 308) and degeneration resistors (310 and 312). In one embodiment, degeneration resistors 310 and 312 are variable and controlled by the control output signal on connection 272 from transconductance control circuit 270.

The input stage includes two n-channel input field effect transistors 302 and 304. A diode-connected (drain and gate connected) p-channel transistor 306 is connected between Vdd and the drain of transistor 302. Likewise, a p-channel transistor 308 is connected between Vdd and the drain of transistor 304. The source of transistor 302 is coupled to Vss through resistor 310 and transistor 314, and the source of transistor 304 is coupled to Vss through resistor 312 and transistor 314. An optional capacitor 316 is provided between the sources of transistors 302 and 304. In operation, variations in the differential input voltages on the gates of transistors 302 and 304 change currents through transistors 306 and 308. Thus, voltages on intermediate outputs 350 and 351 also change. The intermediate outputs 350 and 351 are respectively coupled to p-channel transistors 318 and 320, of the output stage 301. The currents through transistors 306 and 308, therefore, are mirrored through transistors 320 and 318.

The output stage 301 provides a low current, high impedance output 360. The output provides a current in response to the linear differential input voltage. The output stage includes a pull-up circuit and a pull-down circuit. The pull-up circuit includes transistors 318, 322, 324, 326, 328, 330, 332, 334 and 336. Series connected n-channel transistors 322 and 324 are connected as diodes (gate coupled to drain) and conduct the same current mirrored in transistor 318. Transistors 326 and 328 are sized to conduct one-tenth the current of transistors 322 and 324, respectively. Thus, the current through transistors 322 and 324 is mirrored and divided by ten through transistors 326 and 328. This reduced current is mirrored through p-channel transistors 330 and 332 to p-channel transistors 334 and 336. Transistors 334 and 336 are coupled to output node 360 to pull-up the output node and increase the output current.

The output stage pull-down circuit includes transistors 320, 340, 342, 344, and 346. Series connected n-channel transistors 340 and 342 are connected as diodes (gate coupled to drain) and conduct the same current mirrored in transistor 320. Transistors 344 and 346 are sized to conduct one-tenth the current of transistors 340 and 342, respectively. Thus, the current through transistors 340 and 342 is mirrored and divided by ten through transistors 344 and 346. Transistors 344 and 346 are coupled to output node 360 to pull-down the output node and decrease the output current.

In operation, transistor 314 is activated and the differential voltage across the gates of transistors 302 and 304 results in a current output at node 360. Thus, as a voltage on the gate of transistor 302 increases, the current through transistors 334 and 336 increases. Likewise, as a voltage on the gate of transistor 304 increases, the current through transistors 344 and 346 increases.

Figure 5:
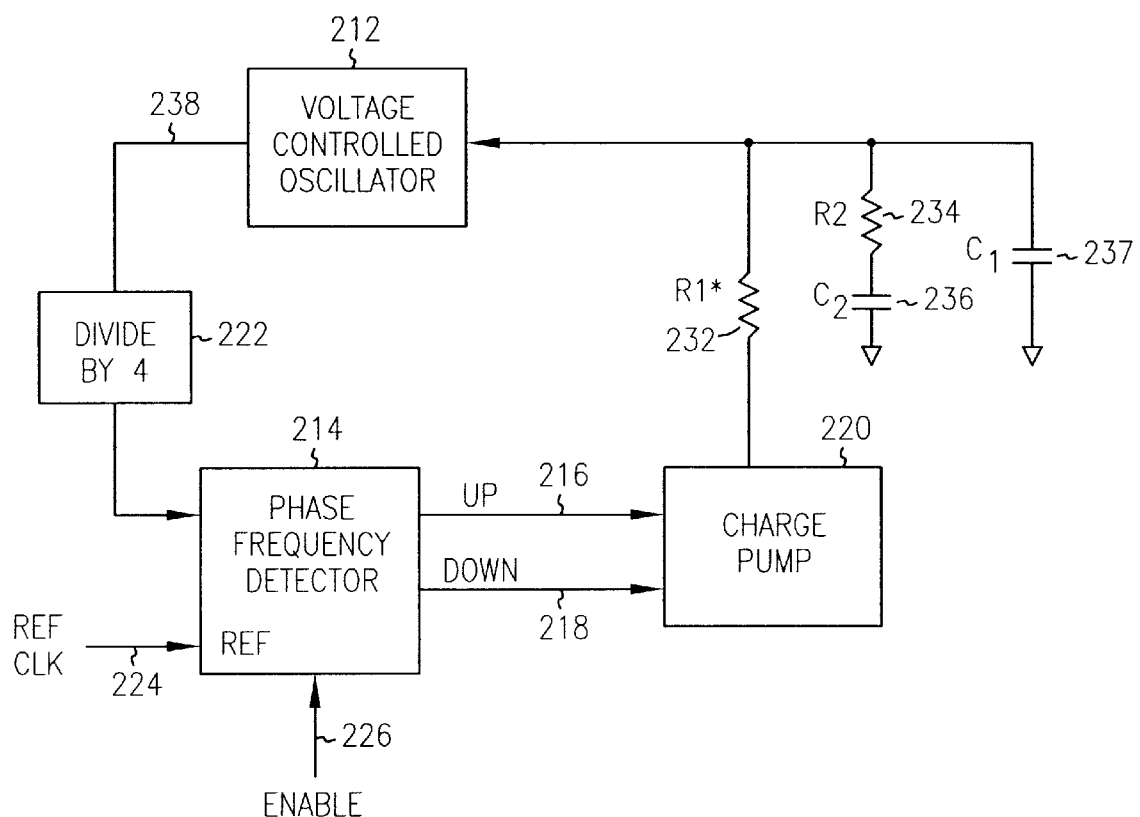
FIG. 5 is a diagram of a coarse loop circuit.

A schematic diagram of the coarse loop is shown in FIG. 5. The coarse loop includes a phase frequency detector 214 which uses a reference clock (REF CLK) input 224 and a divided down output of the VCO circuit 212. The output of the VCO circuit is divided by four using divider circuit 222. An enable signal can be provided at input 226 to the phase frequency detector to inhibit the operation of the coarse loop after frequency acquisition by the VCO. The phase frequency detector provides output signals 216 and 218 to control charge pump 220. The charge pump provides an output current through resistor 232 ($R_1^*$). Again, this current is coupled to resistor 234, capacitor 236 and the shared oscillator circuit 212. Thus, the coarse loop is used to adjust the frequency of the VCO circuit to the reference clock (REF CLK) 224.

The coarse PLL can be described by:

$$\omega_N^* = \sqrt{\frac{K_O I_P}{2\pi C_2 N}} \quad (3)$$

-continued
and $$\zeta^* = \frac{\omega_N^*}{2} R_2 C_2 \quad (4)$$

where $\omega_n^*$ is the natural frequency and $\zeta^*$ is the damping factor. The asterisk is used here to identify variables associated with the coarse PLL. The variables $K_O$, $R_1^*$, $R_2$ and $C_2$ are similar to those defined for the fine PLL. $I_P$ is the maximum current of the charge pump 220 and N is equal to 4, which corresponds to the divider (Divide by 4) circuit 222. Since both the transconductance 210 and charge pump 220 circuits provide current pulses, resistors $R_1$ and $R_1^*$ can be made small. For example, the resistances can be 100Ω, or smaller, even zero.

The above described receiver embodiment provides a high speed clock recovery circuit which operates on a 1 V single-sided peak-to-peak input signal. Because the input voltage can vary from 200 mV to 1 V single-sided peak-to-peak, another embodiment of the receiver circuit includes variable gain amplification to increase the one-sided transconductance from about 10 $\mu$S to about 50 $\mu$S. Before describing a receiver circuit which includes variable gain amplification, it is noted that the high speed data rates and a 0.25 to 0.35 $\mu$m CMOS fabrication process does not allow for reliable variable gain amplification at the input of the phase detector 204. Thus, the following embodiments implement a unique variable gain amplifier implemented with the transconductance circuit. It will be understood that in the above described circuitry, the number of latches, data outputs, VCO stages, crystal frequency, magnitude of the transconductance and the divider circuit is not critical to the invention. These numbers can be varied by one skilled in the art, upon reading the present description, without deviating from the present invention.

As described above, the transconductance circuit 210 of FIGS. 3 and 4 includes an input stage 300 which is configured as a differential amplifier with active/transistor loads (306 and 308) and degeneration resistors (310 and 312). In one embodiment of the transconductance circuit for the Gigabit receiver, a transconductance of about 10 $\mu$S is needed for a 1V, single-sided, peak-to-peak voltage. The transconductance should increase to 50 $\mu$S when a 200 mV, single-sided peak-to-peak voltage is applied as input to the phase detector 204. A transconductance circuit with an inverse linear relationship between the input voltage magnitude and the transconductance is desired.

Figure 6B:
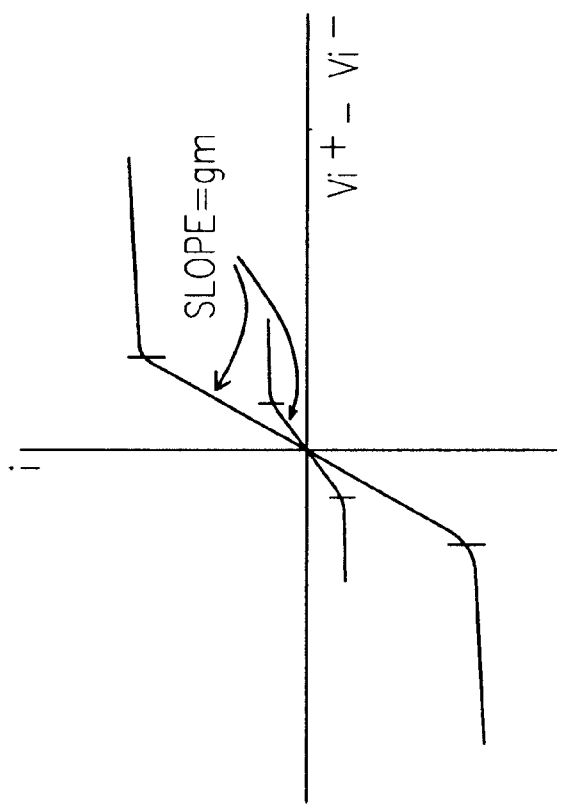
FIG. 6B is a graph illustrating operation of the input stage of FIG. 6A.
Figure 6A:
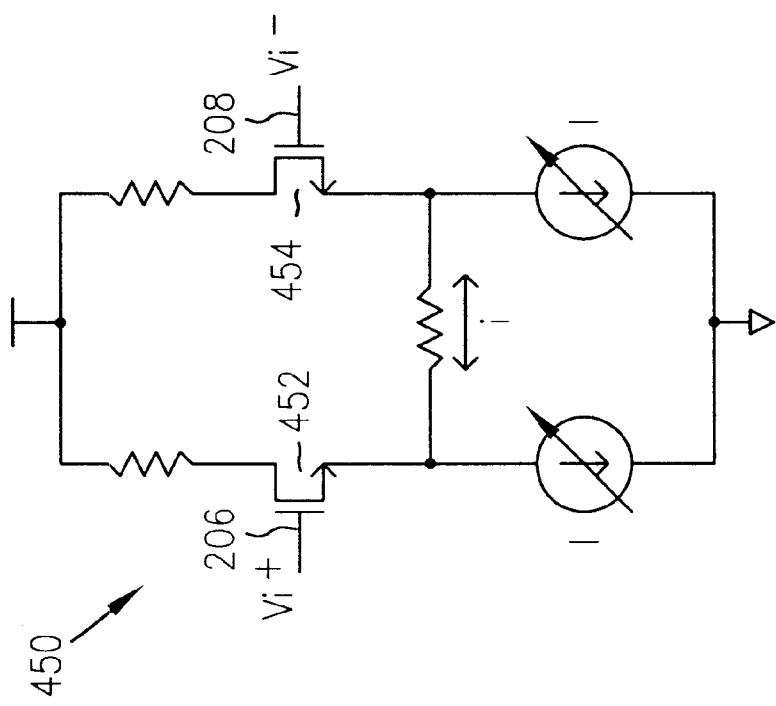
FIG. 6A is a schematic diagram of an input stage for a transconductor.

To illustrate a problem with achieving an inverse linear relationship, an example input stage 450 is shown in FIGS. 6A and 6B. The $g_m$ value of this circuit can be programmed by varying the value of the bias currents I. The linear range for the circuit of FIGS. 6A and 6B is defined as the region $(V_i^+ - V_i^-)$ where the slope of current I vs $(V_i^+ - V_i^-)$ curve is constant to within a predefined linear specification. This slope is the $g_m$ value:

$$g_m = \left| \frac{i}{V_i^+ - V_i^-} \right| \quad (5)$$

The linear range of the circuit of FIG. 6A is directly proportional to the excess bias voltage of transistors 452 and 454 (vdsat), and vdsat≈Vgs–Vt. Where Vgs is the gate to source voltage of transistors 452 and 454, and Vt is the threshold voltage of transistors 452 and 454. The following proportionality relationships hold between the different parameters for circuit 450: linear range $g_m$ vdsat I.

Thus, as the $g_m$ value increases, the linear range for circuit 450 increases. Likewise, as the $g_m$ value decreases, the linear range for circuit 450 decreases. This behavior is opposite of what is needed for the fine loop transconductance circuit.

Figure 7B:
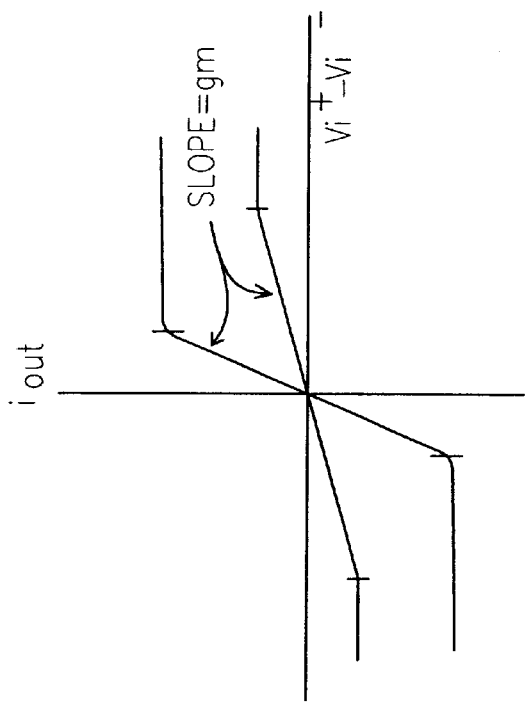
FIG. 7B is a graph illustrating operation of the dual transconductance circuit of FIG. 7A.
Figure 7A:
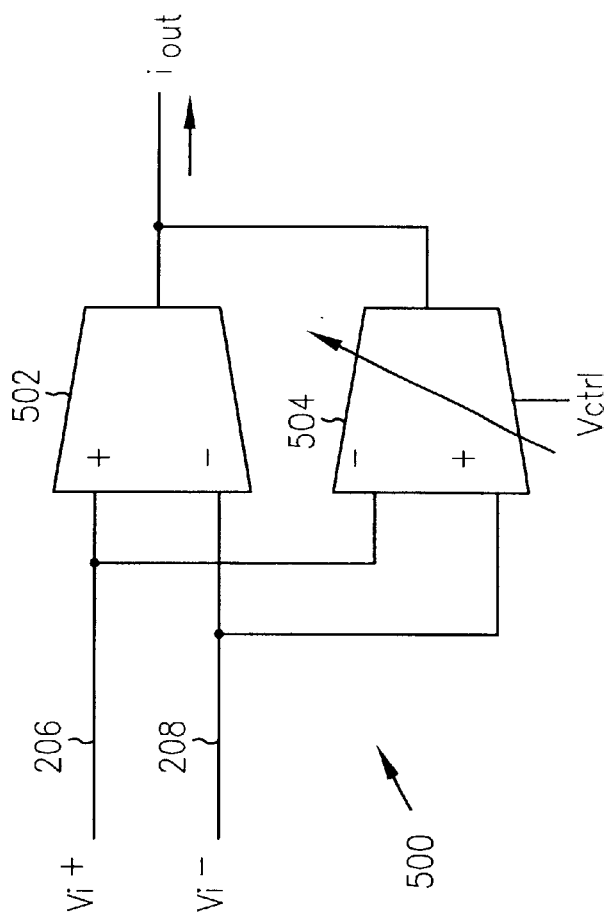
FIG. 7A is a block diagram of a dual transconductance circuit.

FIGS. 7A and 7B illustrate a transconductance circuit 500 which has an inverse linear relationship between the input differential voltage and the transconductance. The circuit 500 solves the problem of the relationship between the $g_m$ value and the linear range, but also allows for a large programming range. For a 3V CMOS process, circuit 500 can achieve a programming range of 5× to 10×. Thus, the receiver could support input voltages from 200 mV to 1V peak-to-peak single-ended. Transconductance circuit 500 can be used as one embodiment of transconductance circuit 210 of FIG. 2.

The circuit of FIG. 7A has two (almost identical) transconductance circuits 502 and 504 which are connected in parallel to receive the differential analog voltage inputs. The first transconductor 502 has a fixed transconductance $g_{m1}$, and the second transconductor 504 has a variable transconductance $g_{m2}$. Transconductance circuit 504 has its inputs reversed in comparison to circuit 502. Thus, the overall effective transconductance for the dual circuit approach can be expressed as:

$$g_m = \left| \frac{iout}{V_i^+ - V_i^-} \right| = g_{m1} - g_{m2} \qquad (6)$$

If the transconductance $g_{m1}$ of the first circuit 502 is set at about 100 µS, and the transconductance $g_{m2}$ of the second circuit 504 varies from about 50 µS to 90 µS, the effective transconductance has a 5× range from 10 µS to 50 µS. If both transconductance circuits ($g_{m1}$ and $g_{m2}$) use the input stage embodiment 300, shown in FIG. 4, the relationship between the $g_m$ (effective) value and linear range of the transconductor is as shown in FIG. 7B. The control voltage (vctrl) for transconductor 504 is generated by a control loop that adjusts the voltage according to the magnitude of the receiver input signal 202. It will be recognized by reading the description that a control current ictrl could be used in place of a control voltage. This control loop is referred to as an automatic gain control (AGC) loop, which is described in greater detail in the following section.

Figure 8:
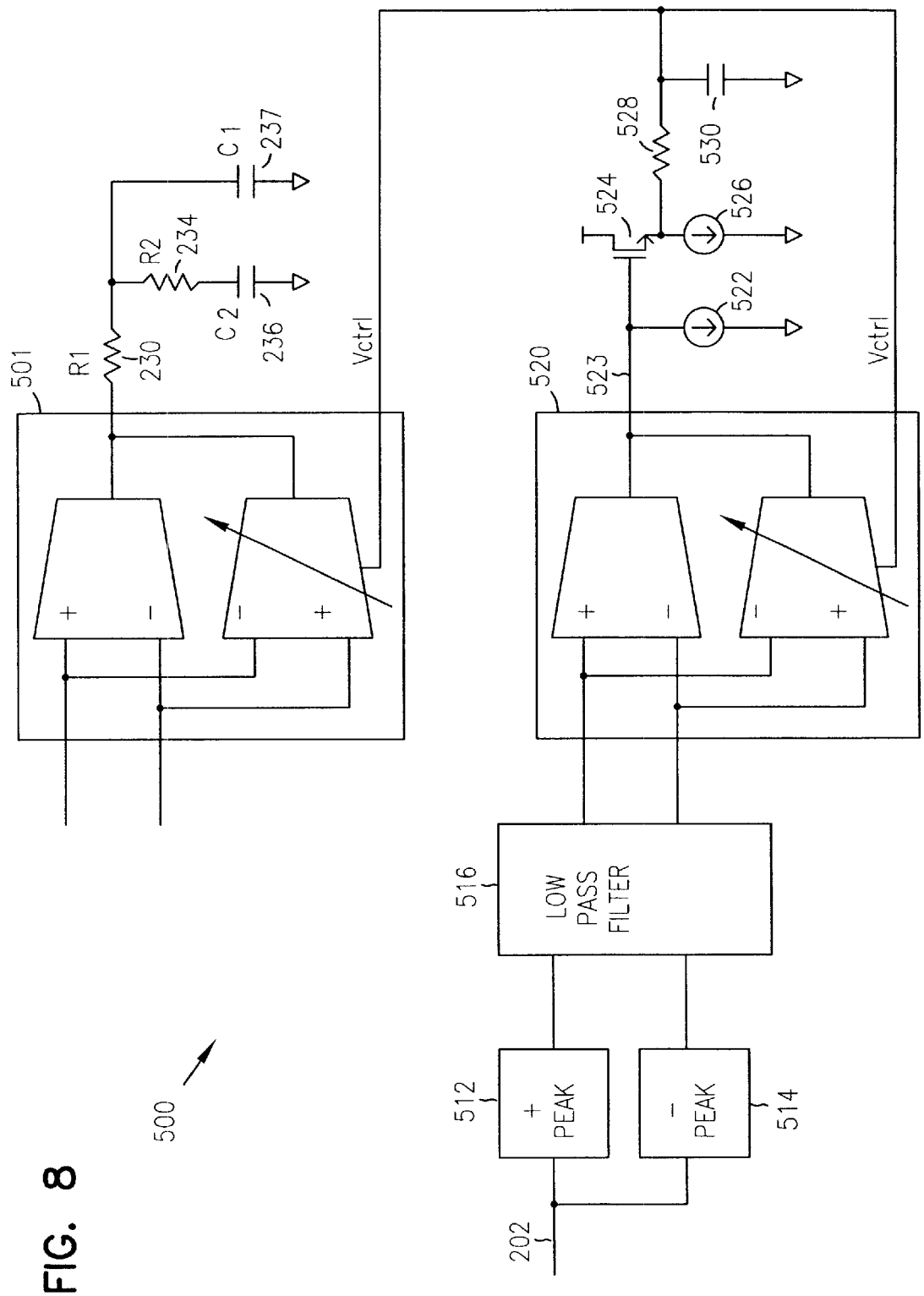
FIG. 8 is one embodiment of a transconductance circuit including an automatic gain control circuit.

One embodiment of a transconductance circuit 501, having an AGC loop, for the receiver circuit is shown in FIG. 8. Transconductance circuit 501 can be used as one embodiment of transconductance circuit 210, and the AGC circuit is one embodiment of envelope detector 260 and GM control circuit 270 of FIG. 2. The AGC circuit has two peak detectors 512 and 514 (positive and negative peaks) which are connected to one of the inputs 202, either the positive or negative input, of the fine loop phase detector 204. The output of the peak detectors are coupled to a low pass filter 516, and a low frequency signal (ideally DC) is presented at the input of a master transconductance circuit 520. The value of the low frequency signal is equal to the peak-to-peak voltage of the single-ended input signal on input 202. A 10 µA current source 522 is forced at the output of the master transconductance circuit 520. The loop reacts in such a way as to maintain the product of the input voltage to the master transconductance circuit, multiplied by the transconductance of the master transconductance circuit equal to 10 µA:

(Voltage at the input of circuit 520)*$g_m$=10 µA    (7)

The loop accomplishes this by lowering or raising the control voltage Vctrl. Finally, the same control voltage, Vctrl, controls the value of a slave transconductance circuit 501 in the fine loop PLL, thus producing the desired automatic gain control behavior. The output 523 of transconductance circuit 520 can be used directly as Vctrl. In the embodiment shown, however, transistor 524 and current source 526 are used to level shift the output signal. Likewise, resistor 528 and capacitor 530 are provided to reduce noise on the Vctrl connection. These two circuits (level shift and RC) are optional for signal processing.

Figure 9:
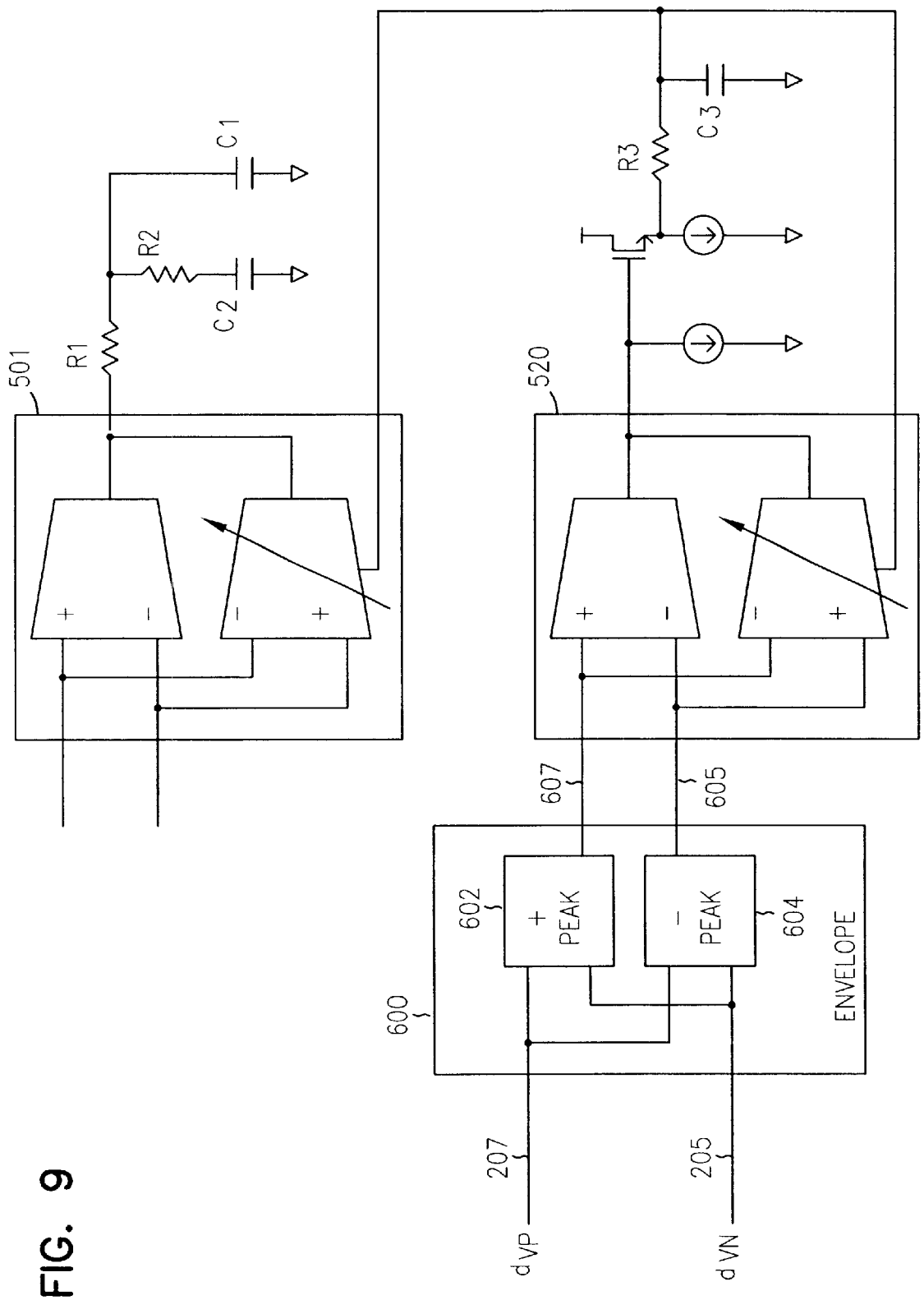
FIG. 9 is another embodiment of a transconductance circuit including an automatic gain control circuit.

FIG. 9 illustrates another embodiment of an automatic gain control circuit which includes master transconductance circuit 520, slave transconductance circuit 501, and an envelope detector circuit 600. The envelope detector is coupled to receive the differential input signals 205 and 207 and provide positive and negative output voltages (on 605 and 607) which represent a voltage envelope of the input signals. The envelope detector includes a positive peak detector 602 and a negative peak detector 604. A detailed description of one embodiment of these peak detectors are provided below with reference to FIG. 11 and FIG. 12, respectively. A general block diagram of the envelope detector is illustrated in FIG. 10.

Figure 10:
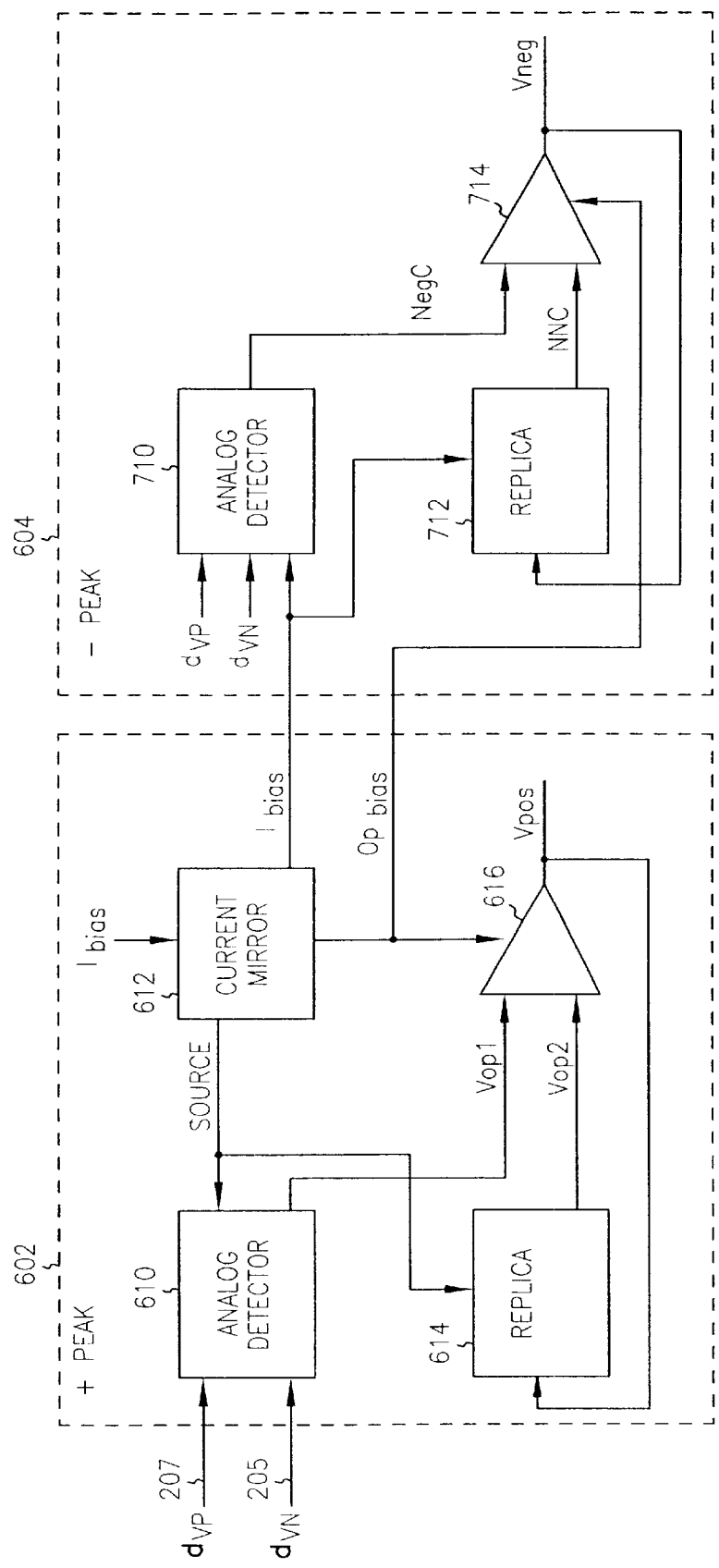
FIG. 10 illustrates a block diagram of an envelope detector circuit.

Referring to FIG. 10, the positive peak detector 602 includes an analog peak detector circuit 610, a current mirror circuit 612, a replica analog detector circuit 614, and an amplifier circuit 616. The negative peak detector 604 includes an analog peak detector 710, a replica analog detector circuit 712 and an amplifier circuit 714. Both the positive and negative peak detector circuits share the current mirror circuit 612. For description purposes, therefore, the current mirror circuit is described as being part of the positive peak detector circuit, but could equally be part of the negative detector, or neither circuit.

Figure 11:
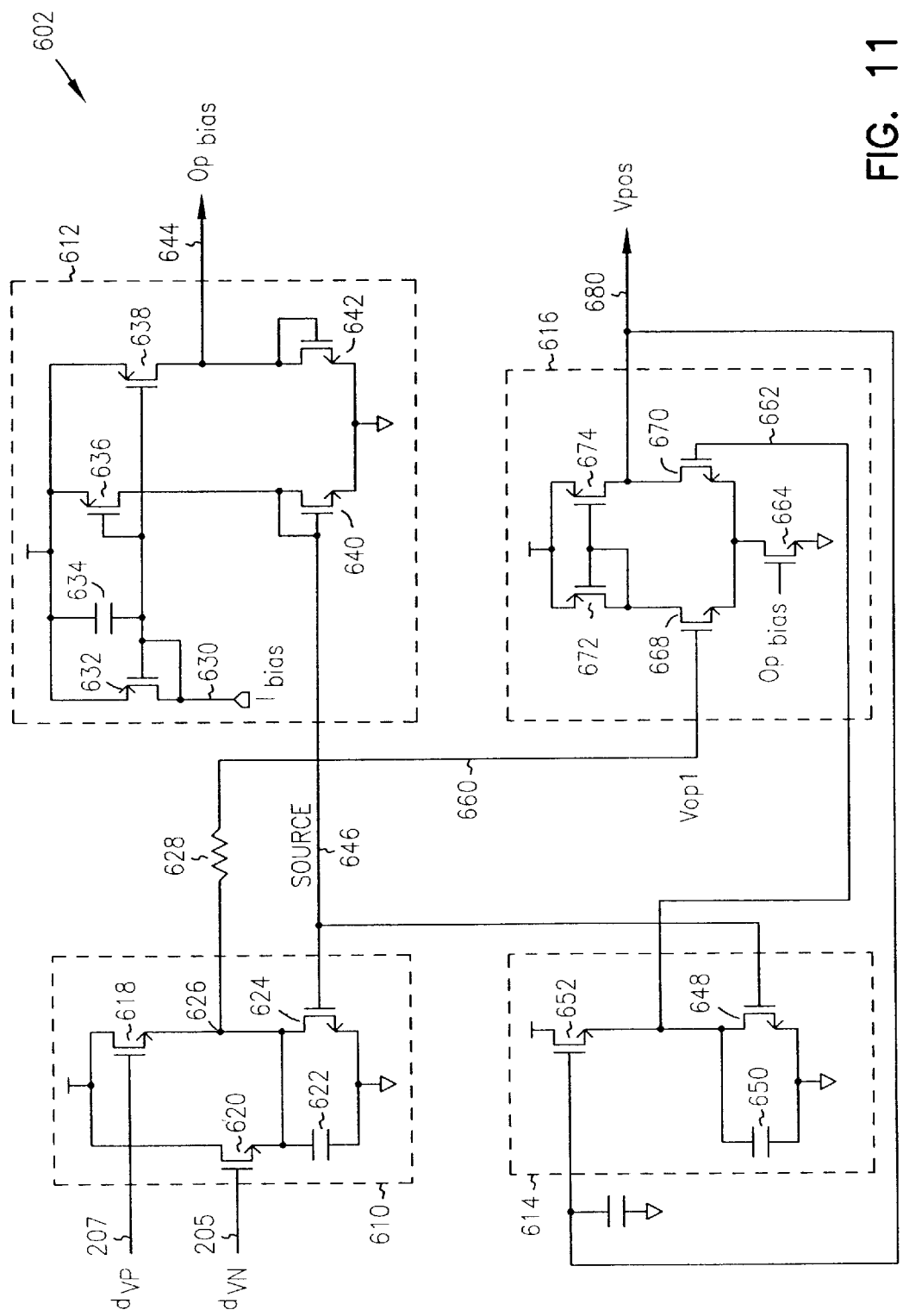
FIG. 11 illustrates one embodiment of a positive peak detector circuit.

FIG. 11 illustrates one embodiment of the positive peak detector circuit 602. The analog peak detector circuit 610 includes first and second pull-up n-channel transistors 618 and 620. The gate of transistor 618 is coupled to receive the positive input voltage signal 207, and the gate of transistor 620 is coupled to receive the negative input voltage signal 205. As explained above, these input signals are complementary such that when one signal is at its positive peak, the other signal is at its negative peak. The analog peak detector circuit provides a near DC voltage signal at output node 626. The output voltage is referred to as near DC because transistors 618 and 620 are alternately activated, as explained below. By alternately activating the transistors, the output voltage on node 626 will not remained steady. Pull-up transistors 618 and 620 are both coupled to charging capacitor 622. A discharge transistor 624 is coupled to capacitor 622 to control a discharge rate of the capacitor. The gate voltage of transistor 624 is controlled by a regulated source, as explained in greater detail below.

In operation, the analog voltage detector circuit charges capacitor 622 to a voltage equal to the positive voltage peak provided on the differential inputs minus Vt. That is, when the positive input signal activates transistor 618, capacitor 622 is charged to a positive voltage. As the positive input signal decreases and transistor 618 is turned off, the negative input signal begins to activate transistor 620. Capacitor 622, therefore, is charged to a positive voltage via transistor 620. Transistor 624 provides a discharge path for capacitor 622 such that node 626 can track the positive voltage peak of the differential input signals. That is, over time the input amplitude may change and the voltage on capacitor 622 must adjust. It is anticipated that the input signal will vary between 200 mV and 1 V peak-to-peak. The voltage provided on node 626 is coupled to the amplifier circuit input node 660 via a filter resistor 628.

The amplifier circuit 616 includes two inputs, 660 and 662, and an output connection 680. Output connection 680 provides a positive voltage signal which is coupled to the master transconductance circuit 520. The amplifier circuit includes input transistor 668 which controls a current through P-channel transistor 672. The current conducted through transistor 672 is mirrored in P-channel transistor 674. A bias transistor 664 is provided for enabling the amplifier circuit and providing a constant bias current. The voltage on output connection 680 is controlled by transistor 670 and transistor 674. Transistor 670 is controlled by the replica analog detector circuit 614. Transistors 668 and 670 are equal in size, likewise transistors 672 and 674 are equal in size. As explained below, the input voltage on node 660 and the input voltage on node 662 are equal such that the amplifier keeps the voltages at 660 and 662 equal by driving the gate of transistor 652 to be equal to the positive envelope of the input signals at the gates of 618 and 620.

Replica analog detector circuit 614 provides a DC input voltage to amplifier input node 662. The replica circuit includes an n-channel pull-up transistor 652 which is identical to pull-up transistor 618. The pull-up transistor is coupled to a charging capacitor 650 and a discharge transistor 648. The charging capacitor and discharge transistor are identical to capacitor 622 and transistor 624. The gate connection of transistor 652 is coupled to receive the output voltage provided on node 680. In operation, transistor 652 is activated to charge capacitor 650. As capacitor 650 is charged, transistor 670 is activated and pulls node 680 down. This decrease in voltage on node 680 reduces the current conducted through transistor 652. This feedback process, therefore, stabilizes the voltage on node 662 to a voltage which is the DC equivalent of the output of the analog peak detector 610. Because the output of circuit 614 is a steady DC voltage, a filter resistor is not coupled between transistors 652 and the gate connection of transistor 670.

The current mirror circuit 612 provides a controlled voltage level which is coupled to the gate connection of transistors 624 and 648 of the analog peak detector circuits. The current mirror circuit is also referred to herein as a regulator circuit which provides a regulated voltage. The current mirror circuit also provides a regulated bias voltage which is coupled to the gate of transistor 664 of the amplifier circuit. The current mirror circuit includes an input connection 630 for receiving a bias current (Ibias). The bias current is a regulated current provided by a current source (not illustrated). The bias current establishes a current through transistor 632 which is mirrored in transistor 636 and transistor 640. The gate of transistor 640 is coupled to the gates of transistors 624 and 648. By controlling the input bias current at node 630, therefore, a controlled voltage source is provided to control the discharge current of capacitors 622 and 650. The current conducted through transistor 632 is also mirrored in transistors 638 and 642. The voltage at node 644 is coupled to bias transistor 664 of the amplifier to control a bias current of the amplifier circuit. Capacitor 634 is provided to stabilize input node 630 against fluctuations in either the bias current or supply voltage.

Figure 12:
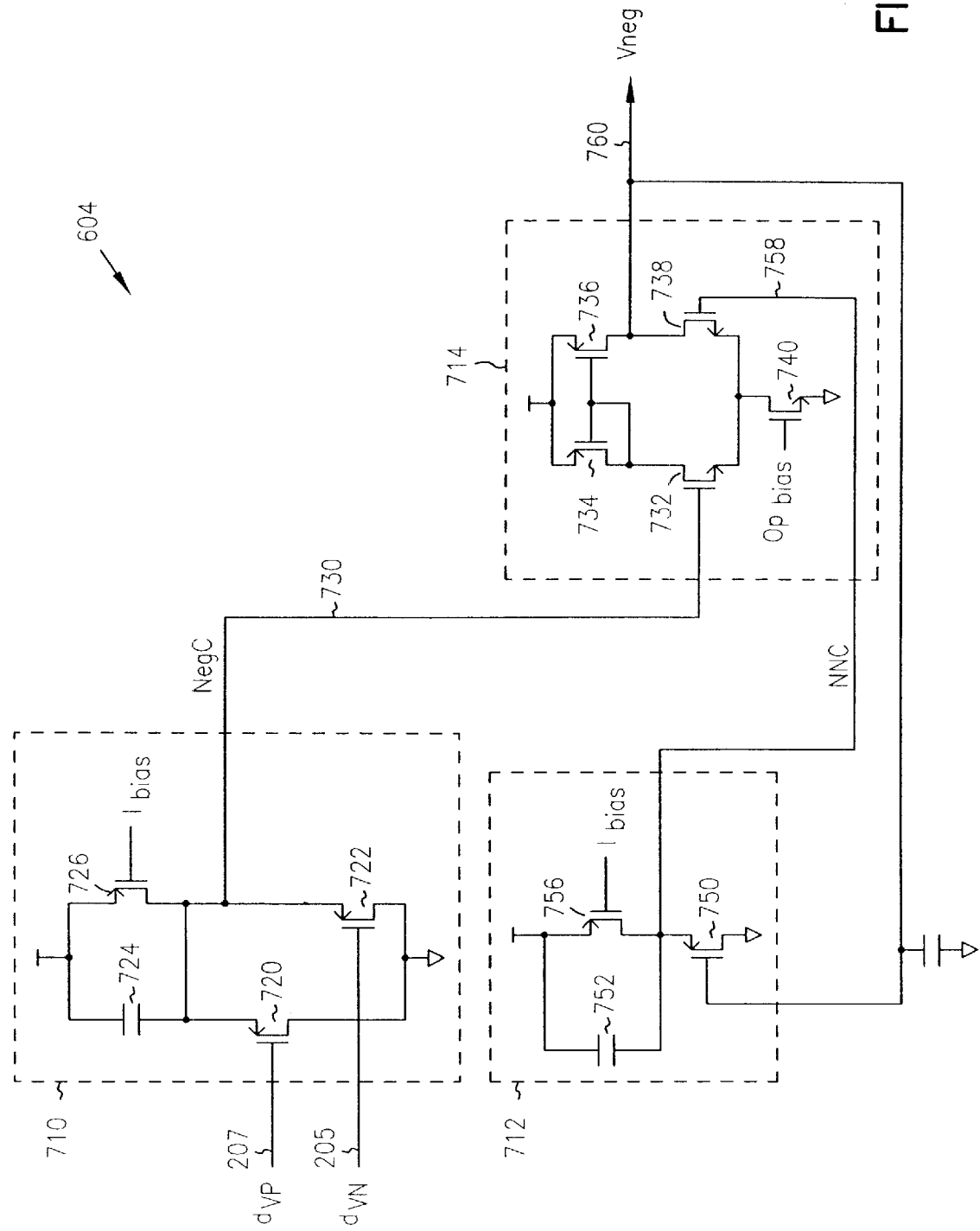
FIG. 12 illustrates one embodiment of a negative peak detector circuit.

Negative peak detector circuit 604 is illustrated in FIG. 12. Again, the negative peak detector circuit includes a negative analog detector circuit 710, a replica peak detector circuit 712 and an amplifier circuit 714. The analog peak detector circuit 710 includes p-channel pull-down transistors 720 and 722 which are coupled to receive the positive input signal and the negative input signal, respectively. The pull-down transistors are coupled to capacitor 724. The p-channel pull-up transistor 726 is coupled to capacitor 724 to control a discharge path of the capacitor. This circuit operates in a manner similar to circuit 610 of the positive peak detector, described above. That is, transistors 720 and 722 are alternately activated to provide a voltage on node 730 which approximates the lower peak voltage level of the input signals. The voltage on node 730 is a near DC voltage signal, and does contain fluctuations which result from the activation and deactivation of transistors 720 and 722.

The voltage provided on node 730 is coupled to amplifier circuit 714. Amplifier circuit 714 is identical to amplifier circuit 616 of the positive peak detector circuit. The input voltage on node 730 is coupled to a gate connection of transistor 732, and a current conducted through transistor 732 and transistor 734 is mirrored in transistor 736. The amplifier circuit includes a bias transistor 740 and an n-channel pull down transistors 738. The gate of transistor 738 is coupled to an output connection 758 of replica circuit 712.

The replica circuit includes a pull-down P-channel transistor 750, charging capacitor 752 and a discharge transistor 756. This circuitry is identical in size to transistor 722, capacitor 724 and transistor 726 of the analog peak detector 710. In operation, analog detector 710 provides an output voltage on node 730 which is approximately equal to the lower peak voltage provided on the input connections. This input voltage activates transistor 732 of the amplifier circuit and controls a voltage on node 760. The output voltage on node 760 activates transistor 750 which adjusts the input voltage on node 758. As a result, the voltage on node 758 is stabilized to a voltage which is the DC equivalent of the voltage provided on node 730.

The envelope circuit 600, described above and shown in FIG. 9, provides a complimentary pair of voltage output signals whose difference is equal to the envelope of the differential input signals. The output voltage signals are used to control master transconductance circuit 520, illustrated in FIG. 9. The master transconductance circuit provides a controlled voltage to slave transconductance circuit 501. The result is an automatic gain control circuit which detects changes in the peak voltage amplitudes of the differential input voltage signals and adjusts a gain of a transconductance circuit such that the output of the slave transconductance circuit is adjusted so that the phase lock loop characteristics are independent of the input signal amplitude.

Conclusion

A high speed data communication system has been described which has a receiver to recover data and clock signals from the communicated data. The receiver circuit has a dual-loop phase lock loop (PLL) circuit. A fine loop of the PLL includes a phase detector having a differential analog voltage output. Transconductance circuitry has been described which converts the differential analog voltage output to a low current analog output. The transconductance circuitry has a high impedance output, a small transconductance value (~10 to 50 $\mu$S) and has a variable gain control. Gain control circuitry has been described for adjusting the transconductance of the transconductor circuit. A coarse loop of the PLL allows for frequency acquisition of an internal oscillator, or an external reference clock. The gain control circuit includes an envelope detector having a negative and positive peak detector circuits.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A high speed data receiver comprising:

differential input connections for receiving differential analog input voltage signals;

a phase detector circuit coupled to receive the differential analog input voltage signals and provide a differential analog voltage output;

a transconductance circuit coupled to the phase detector circuit for converting the differential analog voltage output into an analog output current, the transconductance circuit has a gain which is dependent upon a control voltage;

a filter network for converting the output current from the transconductance circuit into an analog voltage to be used as input for the oscillator;

the oscillator is coupled to the transconductance circuit through the filter network and providing a second input signal to the phase detector in response to the analog output current; and an automatic gain control circuit coupled to the transconductance circuit for providing the control voltage signal in response to an amplitude differential of the differential analog input voltage signals.

2. The high speed data receiver of claim 1 wherein the automatic gain control circuit comprises an envelope detector and a master transconductance circuit.

3. The high speed data receiver of claim 2 wherein the envelope detector comprises:

a positive peak detector circuit for detecting an upper peak voltage of the differential analog input voltage signals; and a negative peak detector circuit for detecting a lower peak voltage of the differential analog input voltage signals.

4. The high speed data receiver of claim 3 further comprises a regulator circuit for providing a regulated voltage to the positive and negative peak detector circuits.

5. The high speed data receiver of claim 4 wherein the regulator circuit comprises a current mirror circuit which is coupled to receive a regulated bias current, and provides the regulated voltage.

6. The high speed data receiver of claim 3 wherein the positive peak detector circuit comprises:

an analog peak detector circuit;

a replica analog peak detector circuit; and an amplifier circuit coupled to the analog peak detector circuit and the replica analog peak detector circuit.

7. The high speed data receiver of claim 6 wherein the analog peak detector circuit comprises:

a first pull up transistor having a gate coupled to receive a first one of the differential analog input voltage signals;

a second pull up transistor having a gate coupled to receive a second one of the differential analog input voltage signals;

a first charge capacitor coupled to the first pull up transistor and the second pull up transistor; and a first discharge transistor coupled to the charge capacitor for providing a first capacitor discharge current.

8. The high speed data receiver of claim 7 wherein the replica analog peak detector circuit comprises:

a third pull up transistor having a gate coupled to receive an output voltage provided by the amplifier circuit;

a second charge capacitor coupled to the third pull up transistor; and a second discharge transistor coupled to the second charge capacitor for providing a second capacitor discharge current.

9. The high speed data receiver of claim 3 wherein the negative peak detector circuit comprises:

an analog peak detector circuit;

a replica analog peak detector circuit; and an amplifier circuit coupled to the analog peak detector circuit and the replica analog peak detector circuit.

10. The high speed data receiver of claim 9 wherein the analog peak detector circuit comprises:

a first pull down transistor having a gate coupled to receive a first one of the differential analog input voltage signals;

a second pull down transistor having a gate coupled to receive a second one of the differential analog input voltage signals;

a first charge capacitor coupled to the first pull down transistor and the second pull down transistor; and a first discharge transistor coupled to the charge capacitor for providing a first capacitor discharge current.

11. The high speed data receiver of claim 10 wherein the replica analog peak detector circuit comprises:

a third pull down transistor having a gate coupled to receive an output voltage provided by the amplifier circuit;

a second charge capacitor coupled to the third pull down transistor; and a second discharge transistor coupled to the second charge capacitor for providing a second capacitor discharge current.

12. The high speed data receiver of claim 1 wherein the transconductance circuit has a variable transconductance value in a range of about 10 to 50 $\mu S$.

13. The high speed data receiver of claim 1 wherein the high speed input data signal has a frequency of about 1.25 GHz.

14. A data receiver circuit comprising:

differential input connections for receiving differential analog input voltage signals;

a phase detector circuit coupled to receive the differential analog input voltage signals and provide a differential analog voltage output;

a slave transconductance circuit coupled to the phase detector circuit for converting the differential analog voltage output into an analog output current, the transconductance circuit has a variable gain;

a filter network for converting the output current from the transconductance circuit into an analog voltage to be used as input for the oscillator;

the oscillator is coupled to the transconductance circuit through the filter network and provides a second input signal to the phase detector in response to the analog output current;

a master transconductance circuit coupled to the slave transconductance circuit for controlling the variable gain of the slave transconductance circuit; and an envelope detector coupled to the master transconductance circuit, the envelope detector providing an upper voltage output signal and a lower output voltage signal which define a peak amplitude differential of the differential analog input voltage signals.

15. The data receiver circuit of claim 14 wherein the variable gain of the slave transconductance circuit is in the range of 10 to 50 µS.

16. The data receiver circuit of claim 14 wherein the slave transconductance circuit comprises:
- a first transconductor circuit having a fixed gain; and
- a second transconductor circuit, coupled in parallel with the first transconductor circuit, having a variable gain, the first and second transconductor circuits are inversely coupled such that the gain of the slave transconductance circuit is equal to a difference between the fixed gain of the first transconductor circuit and the variable gain of the second transconductor circuit.

17. The data receiver circuit of claim 16 wherein the fixed gain of the first transconductor circuit is approximately 100 µS, and the variable gain of the second transconductor circuit is in the range of approximately 50 to 90 µS, such that the gain of the slave transconductance circuit is in the range of 10 to 50 µS.

18. The data receiver circuit of claim 14 wherein the envelope detector comprises:
- a positive peak detector circuit for detecting an upper peak voltage of the differential analog input voltage signals; and
- a negative peak detector circuit for detecting a lower peak voltage of the differential analog input voltage signals.

19. The data receiver circuit of claim 18 wherein the negative and positive peak detector circuits each comprise:
- an analog peak detector circuit;
- a replica analog peak detector circuit; and
- an amplifier circuit coupled to the analog peak detector circuit and the replica analog peak detector circuit.

20. A data receiver circuit comprising:
- differential input connections for receiving differential analog input voltage signals;
- a phase detector circuit coupled to receive the differential analog input voltage signals which provides a differential analog voltage output;
- a slave transconductance circuit coupled to the phase detector circuit for converting the differential analog voltage output into an analog output current, the slave transconductance circuit comprises:
  - a first transconductor circuit having a fixed gain, and
  - a second transconductor circuit, coupled in parallel with the first transconductor circuit, having a variable gain, the first and second transconductor circuits are inversely coupled such that the gain of the slave transconductance circuit is equal to a difference between the fixed gain of the first transconductor circuit and the variable gain of the second transconductor circuit;
- a filter network for converting the output current from the transconductance circuit into an analog voltage to be used as input for the oscillator;
- the oscillator is coupled to the transconductance circuit through the filter network and provides a second input signal to the phase detector in response to the analog output current;
- a master transconductance circuit coupled to the second transconductor circuit for controlling the variable gain of the slave transconductance circuit; and
- an envelope detector coupled to the master transconductance circuit, the envelope detector providing an upper voltage output signal and a lower output voltage signal which define a peak amplitude differential of the differential analog input voltage signals, the envelope detector comprises:
  - a positive peak detector circuit for detecting an upper peak voltage of the differential analog input voltage signals, and
  - a negative peak detector circuit for detecting a lower peak voltage of the differential analog input voltage signals.

21. The data receiver circuit of claim 20 wherein the variable gain of the slave transconductance circuit is in the range of 10 to 50 µS.

22. The data receiver circuit of claim 20 wherein the fixed gain of the first transconductor circuit is approximately 100 µS, and the variable gain of the second transconductor circuit is in the range of approximately 50 to 90 µS, such that the gain of the slave transconductance circuit is in the range of 10 to 50 µS.

23. A data communication system comprising:
- a transmitter for transmitting high speed data on differential communication lines; and
- a receiver coupled to the communication lines for receiving the high speed data and extracting a clock signal, the receiver comprises:
  - differential input connections for receiving differential analog input voltage signals provided on the communication lines;
  - a phase detector circuit coupled to receive the differential analog input voltage signals and provide a differential analog voltage output;
  - a transconductance circuit coupled to the phase detector circuit for converting the differential analog voltage output into an analog output current, the transconductance circuit has a gain which is dependent upon a control voltage;
  - a filter network for converting the output current from the transconductance circuit into an analog voltage to be used as input for the oscillator;
  - the oscillator is coupled to the transconductance circuit through the filter network and provides a second input signal to the phase detector in response to the analog output current; and
  - an automatic gain control circuit, comprising an envelope detector and a master transconductance circuit, coupled to the transconductance circuit for providing the control voltage signal in response to an amplitude differential of the differential analog input voltage signals.

24. The data communication system of claim 23 wherein the envelope detector comprises:
- a positive peak detector circuit for detecting an upper peak voltage of the differential analog input voltage signals; and
- a negative peak detector circuit for detecting a lower peak voltage of the differential analog input voltage signals.

25. The data communication system of claim 24 wherein the positive and negative peak detector circuits each comprise:
- an analog peak detector circuit;
- a replica analog peak detector circuit; and
- an amplifier circuit coupled to the analog peak detector circuit and the replica analog peak detector circuit.

26. An integrated circuit device comprising:
- differential input connections for receiving differential analog input voltage signals;
- a slave transconductance circuit coupled to convert a differential analog voltage into an analog output current, the transconductance circuit has a variable gain;

a master transconductance circuit coupled to the slave transconductance circuit for controlling the variable gain of the slave transconductance circuit; and an envelope detector coupled to the differential input connections and the master transconductance circuit.

27. The integrated circuit of claim 26 wherein the slave transconductance circuit comprises:

a first transconductor circuit having a fixed gain, and a second transconductor circuit, coupled in parallel with the first transconductor circuit, having a variable gain, the first and second transconductor circuits are inversely coupled such that the gain of the slave transconductance circuit is equal to a difference between the fixed gain of the first transconductor circuit and the variable gain of the second transconductor circuit.

28. The integrated circuit of claim 26 wherein the envelope detector provides an upper voltage output signal and a lower output voltage signal which define a peak amplitude differential of the differential analog input voltage signals, the envelope detector comprises:

a positive peak detector circuit for detecting an upper peak voltage of the differential analog input voltage signals, and a negative peak detector circuit for detecting a lower peak voltage of the differential analog input voltage signals.

29. An envelope detector circuit for determining a voltage envelope of analog differential voltage signals, the envelope detector circuit comprises:

a positive peak detector circuit for detecting an upper peak voltage of the differential analog input voltage signals, the positive peak detector circuit comprises:
a first analog peak detector circuit,
a first replica analog peak detector circuit, and
a first amplifier circuit coupled to the first analog peak detector circuit and the first replica analog peak detector circuit; and a negative peak detector circuit for detecting a lower peak voltage of the differential analog input voltage signals, the negative peak detector circuit comprises:
a second analog peak detector circuit,
a second replica analog peak detector circuit, and
a second amplifier circuit coupled to the second analog peak detector circuit and the second replica analog peak detector circuit.

30. The envelope detector circuit of claim 29 wherein the first analog peak detector circuit comprises:

a first pull up transistor having a gate coupled to receive a first one of the differential analog input voltage signals;

a second pull up transistor having a gate coupled to receive a second one of the differential analog input voltage signals;

a first charge capacitor coupled to the first pull up transistor and the second pull up transistor; and a first discharge transistor coupled to the charge capacitor for providing a first capacitor discharge current.

31. The envelope detector circuit of claim 30 wherein the first replica analog peak detector circuit comprises:

a third pull up transistor having a gate coupled to receive an output voltage provided by the amplifier circuit;

a second charge capacitor coupled to the third pull up transistor; and a second discharge transistor coupled to the second charge capacitor for providing a second capacitor discharge current.

32. The envelope detector circuit of claim 29 wherein the second analog peak detector circuit comprises:

a first pull down transistor having a gate coupled to receive a first one of the differential analog input voltage signals;

a second pull down transistor having a gate coupled to receive a second one of the differential analog input voltage signals;

a first charge capacitor coupled to the first pull down transistor and the second pull down transistor; and a first discharge transistor coupled to the charge capacitor for providing a first capacitor discharge current.

33. The envelope detector circuit of claim 32 wherein the second replica analog peak detector circuit comprises:

a third pull down transistor having a gate coupled to receive an output voltage provided by the amplifier circuit;

a second charge capacitor coupled to the third pull down transistor; and a second discharge transistor coupled to the second charge capacitor for providing a second capacitor discharge current.

34. A method of operating a receiver, the method comprising:

receiving differential input signals;

generating an analog voltage representing a phase difference between the input signals and a second signal;

converting the analog signal into an analog current using a transconductor circuit;

detecting upper and lower peak voltages of the input signals; and adjusting a gain of the transconductor circuit in response to a differential magnitude between the upper and lower peak voltages.

35. The method of claim 34 wherein adjusting the gain comprises:

adjusting a transconductance value of a master transconductor circuit in response to the differential magnitude between the upper and lower peak voltages to provide either a control voltage or a control current; and coupling the control voltage or current to the transconductor circuit.

36. The method of claim 34 where detecting the upper and lower peak voltages is performed using an envelope detector circuit.

* * * * *